US012212074B2

(12) United States Patent
Bergman et al.

(10) Patent No.: US 12,212,074 B2
(45) Date of Patent: Jan. 28, 2025

(54) SINGLE DIE DESIGN FOR DIFFERENT POLARIZATIONS

(71) Applicant: NXP B.V., Eindhoven (NL)

(72) Inventors: Jan Willem Bergman, Veghel (NL); Mustafa Acar, Eindhoven (NL); Antonius Hendrikus Jozef Kamphuis, Nijmegen (NL); Dominicus Martinus WilHelmus Leenaerts, Riethoven (NL); Rajesh Mandamparambil, Eindhoven (NL); Paul Mattheijssen, Boxtel (NL)

(73) Assignee: NXP B.V., Eindhoven (NL)

( * ) Notice: Subject to any disclaimer, the term of this patent is extended or adjusted under 35 U.S.C. 154(b) by 553 days.

(21) Appl. No.: 17/651,832

(22) Filed: Feb. 21, 2022

(65) Prior Publication Data
US 2022/0311137 A1    Sep. 29, 2022

(30) Foreign Application Priority Data

Mar. 29, 2021  (EP) .................................... 21165473

(51) Int. Cl.
*H01L 23/66* (2006.01)
*H01Q 3/34* (2006.01)

(52) U.S. Cl.
CPC .............. *H01Q 3/34* (2013.01); *H01L 23/66* (2013.01); *H01L 2223/6677* (2013.01)

(58) Field of Classification Search
CPC .... H01L 23/66; H01L 2223/6677; H01Q 3/34
(Continued)

(56) References Cited

U.S. PATENT DOCUMENTS

2016/0197404 A1    7/2016  Hashimoto et al.
2019/0221947 A1    7/2019  Zihir et al.
(Continued)

FOREIGN PATENT DOCUMENTS

CN            107342458 A        11/2017

OTHER PUBLICATIONS

Saeidi-Manesh, H., "Challenges and Limitations of the Cross-Polarization Suppression in Dual-Polarization Antenna Arrays Using Identical Subarrays", IEEE Transactions on Antennas and Propagation, vol. 68, No. 4, Apr. 2020.
(Continued)

*Primary Examiner* — Igwe U Anya

(57) ABSTRACT

An integrated circuit comprising a package, phased antenna array and die. The die comprises a plurality of unit cells, wherein each unit cell is divided into quadrants. Each quadrant comprises a receiver terminal located on a first axis, and a transmitter terminal located on a second axis, wherein the first axis is orthogonal to the second axis, and there is mirror symmetry between the nearest neighbour quadrants in the unit cell. The package comprises a plurality of pairs of feed lines, each pair of feed lines comprising a receiver feed line and a transmitter feed line. The receiver feed line is connected to one of the receiver terminals and the transmitter feed line is connected to the transmitter terminal in the same die quadrant. The receiver feed line is orthogonal to the transmitter feed line. Each antenna element is coupled to a respective pair of feed lines.

17 Claims, 6 Drawing Sheets

(58) Field of Classification Search
USPC .......................................................... 257/428
See application file for complete search history.

(56) References Cited

U.S. PATENT DOCUMENTS

| | | | |
|---|---|---|---|
| 2019/0260109 A1* | 8/2019 | Gu ....................... | H01L 23/3675 |
| 2019/0260115 A1* | 8/2019 | Tehran ................. | H01Q 9/0414 |
| 2019/0260138 A1 | 8/2019 | Gu et al. | |
| 2020/0059011 A1* | 2/2020 | Sarabandi ............ | H01Q 21/065 |
| 2022/0263223 A1* | 8/2022 | ?Jefors ................... | H01Q 21/08 |

OTHER PUBLICATIONS

Shahramian, S., "A Fully Integrated 384-Element, 16-Tile, W-Band Phased Array With Self-Alignment and Self-Test", IEEE Journal of Solid-State Circuits, vol. 54, No. 9, Sep. 2019.

* cited by examiner

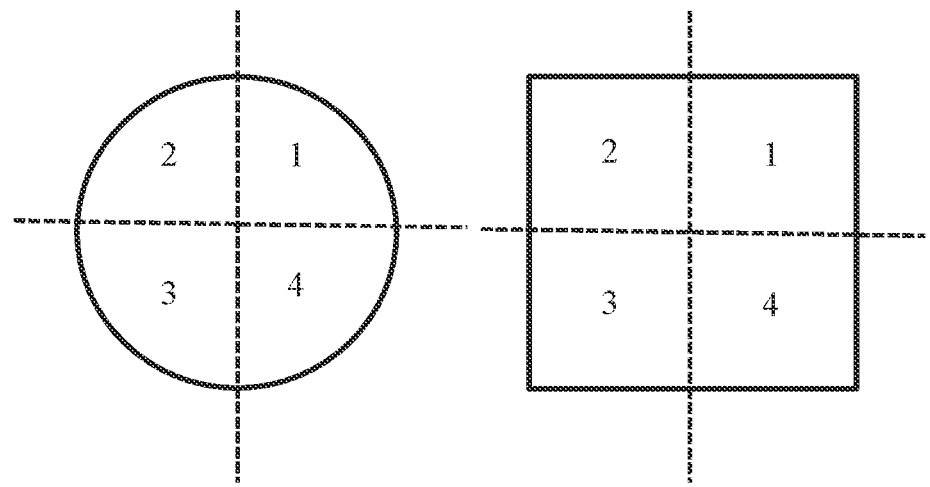
Fig. 1 – PRIOR ART
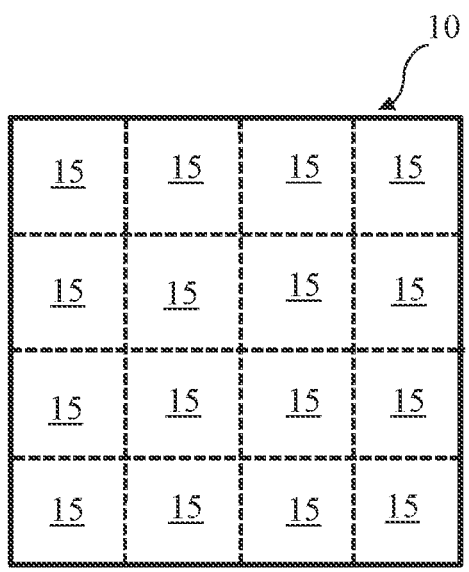
Fig. 2

SINGLE DIE DESIGN FOR DIFFERENT POLARIZATIONS

CROSS-REFERENCE TO RELATED APPLICATIONS

This application claims the priority under 35 U.S.C. § 119 of European Patent application no. 21165473.6, filed on 29 Mar. 2021, the contents of which are incorporated by reference herein.

BACKGROUND

The present specification relates to integrated circuits comprising a package, a phased antenna array and a die, wherein the same die can be used with different antenna polarizations.

For beam-forming of mmWave signals, the antenna array required can become too large to be covered by one die. Therefore, it is known for a package to contain multiple dies to control an antenna array. It is also known to place two or more packages close together on a printed circuit board, each package comprising an antenna sub-array, to form a larger antenna array. To increase the capacity some of the antenna sub-arrays may operate in a horizontal polarization, and other antenna sub-arrays may operate in a vertical polarization.

Typically, antenna arrays or sub-arrays operating in a vertical polarization require a different die to the antenna arrays or sub-arrays operating in a horizontal polarization. This is because the layout of the connections in the package, such as the antenna feed lines and transmission lines, have a different layout depending on the antenna polarization, which then requires a different layout for the die terminals.

Any asymmetry or irregularities between dies or between packages in the array can result in RF loses and reduced performance of the array. In addition, differences between the dies or packages required for different polarizations increases manufacturing time and costs.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided an integrated circuit comprising a package, a phased antenna array comprising a plurality of antenna elements, and a die contained within the package. The die comprises a plurality of unit cells, wherein each unit cell is divided into quadrants, and each quadrant comprises a receiver terminal located on a first axis of the quadrant, and a transmitter terminal located on a second axis of the quadrant, wherein the first axis is orthogonal to the second axis, and wherein the location of the receiver terminal and the transmitter terminal in the nearest neighbour quadrants in a given unit cell has mirror symmetry. The package comprises a plurality of pairs of feed lines, each pair of feed lines comprising a receiver feed line and a transmitter feed line, wherein the receiver feed line is connected to one of the receiver terminals and the transmitter feed line is connected to the transmitter terminal in the same quadrant of the die, wherein the receiver feed line is orthogonal to the transmitter feed line. Each antenna element of the phased antenna array is coupled to a respective pair of feed lines to drive a receiver channel and a transmitter channel.

It will be appreciated that the quadrants of each unit cell of the die could be any shape. They are not limited to being square or rectangular.

The nearest neighbour quadrants to a given quadrant are the quadrants that are adjacent to the quadrant, not including those quadrants that are diagonally adjacent.

The first axis and the second axis in the nearest neighbour quadrants in a given unit cell may have mirror symmetry.

The term 'package' may be used interchangeably with 'integrated circuit package' throughout this disclosure.

The phased antenna array may be contained within the package, thus the package may be an antenna-in-package (AiP) package or a launcher-in-package (LiP) package. In other embodiments, the phased antenna array may be provided externally to the package. The package may be an antenna-on-package (AoP) package, or the antenna array may be attached to the package as a package-on-package (PoP).

Optionally, the phased antenna array may comprise a patch antenna array, such that each antenna element may comprise a patch antenna. However, any type of phased antenna array may be used.

Optionally, each antenna element is aligned with a respective one of the quadrants of the die.

Each receiver feed line may be connected to the respective receiver terminal on the die by a strip line connection, or other electrical connection. Each transmitter feed line may be connected to the respective transmitter terminal on the die by a strip line connection, or other electrical connection.

The plurality of pairs of feed lines may have a first configuration and a second configuration. The configuration of the feed lines may be fixed during manufacture of the package, such that the feed lines are not reconfigurable during use of the integrated circuit. Optionally, in the first configuration, the receiver channel may have a horizontal polarization and the transmitter channel may have a vertical polarization. In the second configuration, the receiver channel may have a vertical polarization and the transmitter channel may have a horizontal polarization.

Thus, the die terminals remain in the same fixed position regardless of whether the antenna feed lines in the package are in the first configuration or the second configuration.

Optionally, in the first configuration each pair of feed lines is rotated relative to the second configuration. In some embodiments each pair of feed lines may be rotated by 90° between the first and second configurations.

In the first configuration, each receiver feed line may be rotated 90° about the respective receiver die terminal relative to the position of the receiver feed line in the second configuration. In the first configuration, each transmitter feed line may be rotated 90° about the respective transmitter die terminal relative to the position of the transmitter feed line in the second configuration.

Optionally, in the first configuration each receiver feed line may have a horizontal orientation and each transmitter feed line may have a vertical orientation. Optionally, in the second configuration each receiver feed line may have a vertical orientation and each transmitter feed line may have a horizontal orientation.

Optionally, the package comprises a plurality of unit cells and each unit cell is divided into quadrants. Each quadrant may comprise one of the pairs of feed lines, and each unit cell of the package may overlay a respective unit cell of the die.

The orientation of the pair of feed lines in the nearest neighbour quadrants in each unit cell of the package may have mirror symmetry.

Each pair of feed lines may be rotated about a centre of the quadrant between the first configuration and the second configuration.

In the first configuration, each pair of feed lines may be rotated 90° in the opposite direction to the nearest neighbour quadrant in the unit cell of the package, relative to the second configuration.

For example, the pair of feed lines in the first quadrant and the third quadrant of a given unit cell of the package may be rotated 90° anti-clockwise in the second configuration relative to the first configuration. The pair of feed lines in the second quadrant and the fourth quadrant of the same unit cell may be rotated 90° clockwise in the second configuration relative to the first configuration.

Optionally, the first axis and the second axis are each axes of symmetry of the die quadrant. Optionally, the first axis and the second axis are each diagonal axes.

Optionally, in each quadrant of the die the receiver terminal and the transmitter terminal are aligned along a third axis. In some embodiments, the third axis may be at an angle of 45° relative to the first axis and the second axis.

Each unit cell of the die may comprise a first quadrant, a second quadrant, a third quadrant and a fourth quadrant. The layout (or numbering) of the quadrants follows standard mathematical convention, as shown in FIG. 1 of the drawings. In each unit cell there may be mirror symmetry between: the first quadrant and the second quadrant; the second quadrant and the third quadrant; the third quadrant and the fourth quadrant; and the fourth quadrant and the first quadrant.

Optionally, the die is configured to apply a phase shift, such as a 180 degree phase shift, to a signal processed by the receiver channel and/or the transmitter channel of the antenna array. The die may comprise a phase shifter circuit.

In some embodiments, a plurality of dies may be contained or mounted in the package. Each die comprises at least one unit cell, wherein each unit cell is divided into quadrants, and each quadrant comprises a receiver terminal located on a first axis of the quadrant, and a transmitter terminal located on a second axis of the quadrant, wherein the first axis is orthogonal to the second axis, and wherein the location of the receiver terminal and the transmitter terminal in the nearest neighbour quadrants in the unit cell has mirror symmetry.

Optionally, the plurality of dies may be identical. Each of the dies may be as described above in any embodiment of the disclosure.

Optionally, in each pair of feed lines the receiver feed line has the same dimensions as the transmitter feed line.

Optionally, each receiver feed line has the same dimensions as each transmitter feed line.

Optionally, the integrated circuit may comprise a plurality of packages, wherein the packages are as described in any embodiment of the disclosure.

In a second aspect, the present disclosure provides a semiconductor device, comprising a plurality of integrated circuits arranged to form an array, wherein each integrated circuit is as defined in any embodiment or example of the first aspect of the invention.

Alternatively, each integrated circuit may be referred to as a multi-package module, wherein each multi-package module comprises a plurality of packages.

The array of integrated circuits may comprise a plurality of columns and a plurality of rows.

In some embodiments, in each integrated circuit in a first column of the array, each pair of antenna feed lines may be in the first configuration, such that the antenna arrays have a first polarization. In each integrated circuit in a second column of the array adjacent to the first column, each pair of antenna feed lines may be in the second configuration, such that the antenna arrays have a second polarization.

In some embodiments, in each integrated circuit in a first row of the array each pair of antenna feed lines may be in the first configuration, such that the antenna arrays have a first polarization. In each integrated circuit in a second row of the array adjacent to the first row, each pair of antenna feed lines may be in the second configuration, such that the antenna arrays have a second polarization.

In a third aspect, the present disclosure provides a method of manufacturing an integrated circuit. The method comprises providing a die, wherein the die comprises a plurality of unit cells, wherein each unit cell is divided into quadrants, and each quadrant comprises a receiver terminal located on a first axis of the quadrant, and a transmitter terminal located on a second axis of the quadrant, wherein the first axis is orthogonal to the second axis, wherein the location of the receiver terminal and the transmitter terminal in the nearest neighbour quadrants in the unit cell has mirror symmetry. The method further includes providing a phased antenna array comprising a plurality of antenna elements, and assembling a package, wherein assembling the package comprises: encasing the die in the package, providing a plurality of pairs of feed lines, each pair of feed lines comprising a receiver feed line and a transmitter feed line, connecting the receiver feed line to one of the receiver terminals and connecting the transmitter feed line to the transmitter terminal in the same quadrant of the die, wherein the receiver feed line is orthogonal to the transmitter feed line; and coupling each antenna element of the phased antenna array to a respective pair of feed lines to drive a receiver channel and a transmitter channel.

Optionally, the method may include providing a plurality of dies and encasing the plurality of dies in the package, wherein each of the dies are as described above. The plurality of dies may be identical.

Optionally, the method may be a method of manufacturing an integrated circuit according to any embodiment of the present disclosure.

In a further aspect, the present disclosure may provide a semiconductor die configured for beamforming a phased antenna array, the die comprising a plurality of unit cells, wherein each unit cell is divided into quadrants, and each quadrant comprises: a receiver terminal located on a first axis of the quadrant; and a transmitter terminal located on a second axis of the quadrant, wherein the first axis is orthogonal to the second axis, wherein the receiver terminal and the transmitter terminal are configured to be connected to an antenna element of a phased antenna array; and wherein the location of the receiver terminal and transmitter terminal in adjacent quadrants of the unit cell has mirror symmetry.

The term 'nearest neighbour' may equivalently be used instead of 'adjacent'.

Optionally, the first axis and the second axis are each axes of symmetry of the die quadrant. Optionally, the first axis and the second axis are each diagonal axes.

Optionally, in each quadrant of the die the receiver terminal and the transmitter terminal are aligned along a third axis. In some embodiments, the third axis may be at an angle of 45° relative to the first axis and the second axis.

Each unit cell of the die may comprise a first quadrant, a second quadrant, a third quadrant and a fourth quadrant. The layout (or numbering) of the quadrants follows standard mathematical convention, as shown in FIG. 1 of the drawings. In each unit cell there may be mirror symmetry between: the first quadrant and the second quadrant; the second quadrant and the third quadrant; the third quadrant and the fourth quadrant; and the fourth quadrant and the first quadrant.

Optionally, the die is configured to apply a phase shift, such as a 180 degree phase shift, to a signal processed by the receiver channel and/or the transmitter channel of the antenna array. The die may comprise a phase shifter circuit.

It will be appreciated that the die may be as defined in any above example or embodiment of the disclosure.

BRIEF DESCRIPTION OF THE DRAWINGS

Illustrative embodiments of this disclosure will be described hereinafter, by way of example only, with reference to the accompanying drawings in which like reference signs relate to like elements and in which:

FIG. 1—is a prior art diagram showing a circle and a square divided into quadrants, illustrating the standard convention for numbering quadrants;

FIG. 2—shows a schematic illustration of a die divided into a plurality of unit cells according to an embodiment of the present disclosure;

DETAILED DESCRIPTION

Embodiments of this disclosure are described in the following with reference to the accompanying drawings. It will be appreciated that the drawings are schematic illustrations and are not drawn to scale.

FIG. 1 is a diagram showing a circle and a square divided into quadrants by two orthogonal axes. Thus, as shown, quadrants do not have to be square in shape. This diagram is provided to show the standard numbering convention for quadrants. By convention, the top-right quadrant is the first quadrant, 1, the top-left quadrant is the second quadrant, 2, the bottom-left quadrant is the third quadrant, 3, and the bottom-right quadrant is the fourth quadrant, 4. This numbering convention will be adhered to throughout the present disclosure.

FIG. 2 is a schematic representation of a die 10 according to an embodiment of the present disclosure. The die 10 may be a beamforming chip. The die 10 is divided into a plurality of unit cells 15. Each unit cell 15 may be the same size and shape. It will be appreciated that although FIG. 2 shows the die 10 comprising a 4×4 array of unit cells, this is not limiting. The die 10 may comprise any number of unit cells 15.

Figure 3:
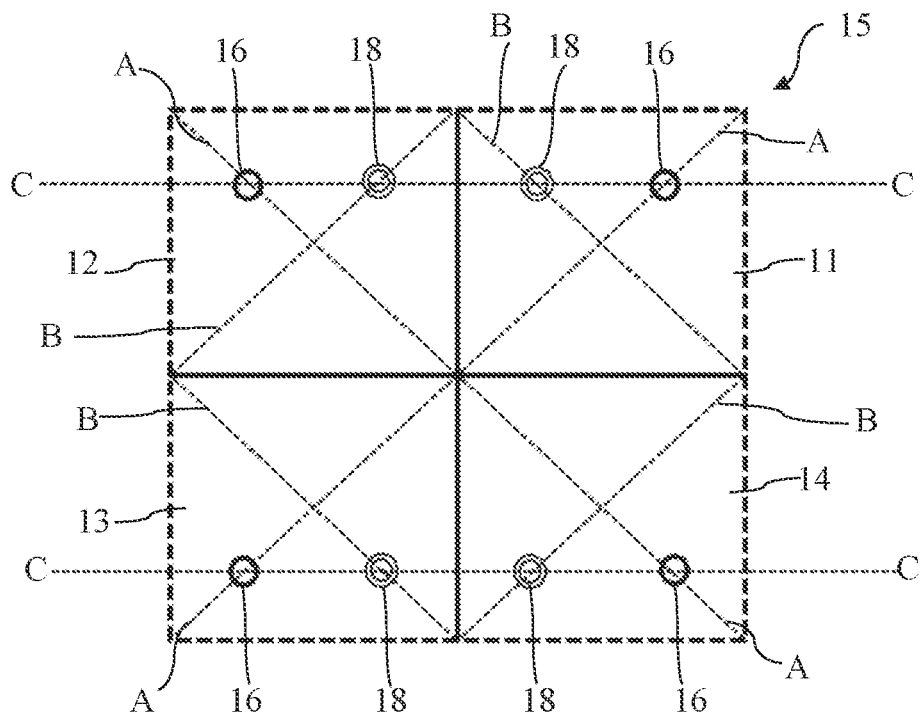
FIG. 3—shows a schematic illustration of one of the unit cells of the die in FIG. 2.

FIG. 3 is a close-up of one of the unit cells 15 of the die 10. The unit cell 15 may be considered to be divided into four quadrants, a first quadrant 11, a second quadrant 12, a third quadrant 13 and a fourth quadrant 14. It will be appreciated that the lines dividing the unit cell 15 into quadrants may be mathematical constructs, as no physical barrier or division may be present. The nearest neighbour quadrants in a unit cell are the quadrants that are immediately adjacent to a given quadrant. For example, for the first quadrant 11 the nearest neighbour quadrants are the second quadrant 12 and the fourth quadrant 14, but not the third quadrant 13.

As shown in FIG. 3, each quadrant comprises a receiver terminal 16 and a transmitter terminal 18. Each receiver terminal 16 is a coaxial input connection for the receiver channel of an antenna element, and each transmitter terminal 18 is a coaxial output connection for the transmitter channel of an antenna element.

In each quadrant 11-14, the receiver terminal 16 is located on a first axis A and the transmitter terminal 18 is located on a second axis B. The first axis A is orthogonal to the second axis B. In this embodiment, the first axis A and the second axis B are diagonal axes. In each quadrant 11-14, the receiver terminal 16 and the transmitter terminal 18 are also aligned along a third axis C of the quadrant, wherein the third axis C intersects the first axis A and the second axis B. In this embodiment, the third axis C is at an angle of around 45° relative to the first axis A and the second axis B. It will be appreciated that the first axis A, the second axis B and the third axis C are mathematical constructs.

As shown in FIG. 3, the location of the receiver terminal 16 and transmitter terminal 18 is not the same in each quadrant 11-14 of the unit cell 15. In other words, the orientation of the first axis A and the second axis B is not the same in all quadrants of the unit cell 15.

There is mirror symmetry between the position of the receiver terminal 16 and the transmitter terminal 18 in the first quadrant 11 and the nearest neighbour quadrants 12 and 14 of the unit cell 15. There is mirror symmetry between the position of the receiver terminal 16 and the transmitter terminal 18 in the second quadrant 12 and the nearest neighbour quadrants 13 and 11 of the unit cell 15. There is mirror symmetry between the position of the receiver terminal 16 and the transmitter terminal 18 in the third quadrant 13 and the nearest neighbour quadrants 12 and 14 of the unit cell 15. There is mirror symmetry between the position of the receiver terminal 16 and the transmitter terminal 18 in the fourth quadrant 14 and the nearest neighbour quadrants 13 and 11 of the unit cell 15.

The orientation of the first axis A and the second axis B in the nearest neighbour quadrants of the unit cell 15 therefore has mirror symmetry.

Figure 4:
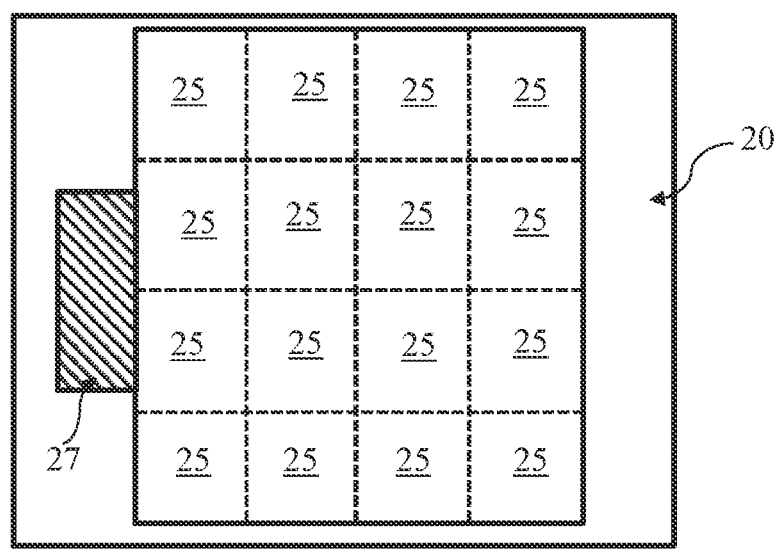
FIG. 4—shows a schematic illustration of a package comprising a plurality of unit cells according to an embodiment of the present disclosure.

FIG. 4 is a schematic representation of a package 20. In this embodiment the package comprises a chip 27 such as an up-down-converter (UDC) and a plurality of unit cells 25. To form an integrated circuit, at least one die 10 is mounted in the package 20. The package 20 may include an antenna array, or an antenna array may be attached to the package 20. When the die 10 is mounted in the package 20 each unit cell 15 of the die may be aligned with a unit cell 25 of the package. Alternatively, the package 20 may be configured to contain multiple dies 10. Each die 10 may comprise a plurality of unit cells 15. For example, referring to FIG. 2, instead of a single die 10 comprising sixteen unit cells, the package may comprise an array of four dies 10 (e.g. a 2×2 array), each die 10 comprising four unit cells 15. Each unit cell 25 of the package may be aligned with one of the die unit cells 15.

Figure 5:
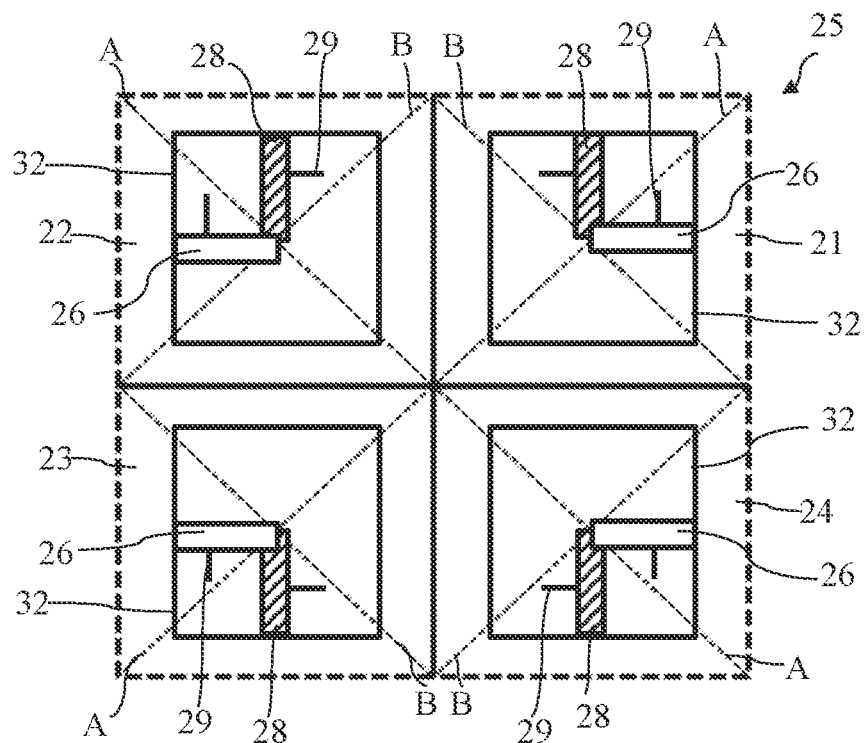
FIG. 5—shows one of the unit cells of the package in FIG. 4 in a first configuration.

FIG. 5 shows a close-up of one of the package unit cells 25 in a first configuration. The first axis A and second axis B of the die quadrants are shown in FIG. 5 to clarify how the package unit cell 25 aligns with the corresponding die unit cell 15. The package unit cell 25 may be considered to be divided into four quadrants, a first quadrant 21, a second quadrant 22, a third quadrant 23 and a fourth quadrant 24. It will be appreciated that the lines dividing the unit cell 25 into quadrants may be mathematical constructs, as no physical barrier or division may be present between quadrants.

Each quadrant 21-24 of the unit cell 25 comprises a pair of feed lines, wherein each pair of feed lines comprises a receiver feed line 26 and a transmitter feed line 28. In each pair, the receiver feed line 26 is orthogonal to the transmitter feed line 28.

Each receiver feed line 26 is configured to be connected to one of the receiver terminals 16 of the die and each transmitter feed line 28 is configured to be connected to one of the transmitter terminals 18 of the die. As shown in FIG. 5, each feed line is coupled to a connector 29, for example a strip line connector 29. The connectors 29 connect the feed lines 26, 28 to the respective die terminal 16, 18.

In use, a phased antenna array comprising a plurality of antenna elements 32 is either embedded in, or connected to, the package 20. The phase antenna array may be a patch antenna array. When the integrated circuit is fully assembled, each antenna element 32, such as a patch antenna, may be aligned with one of the quadrants of the package unit cell 25, and consequently also aligned with one of the quadrants of the die unit cells 15. In FIG. 5, an outline of the antenna elements 32 is illustrated, to show how the antenna array aligns overlays the package unit cells 25. Each pair of feed lines 26, 28 is arranged to be connected to a respective one of the antenna elements 32. Thus, the receiver feed lines 26 drive a receiver channel of the phased antenna array and the transmitter feed lines 28 drive a transmitter channel of the phased antenna array.

In FIG. 5 the feed lines 26, 28 are shown in a first configuration, wherein the receiver feed lines 26 are orientated for horizontal polarization of the antenna array receiver channel and the transmitter feed lines 28 are orientated for vertical polarization of the antenna array transmitter channel.

There is mirror symmetry between the orientation of the pair of feed lines 26, 28 in the nearest neighbour quadrants of the unit cell 25. Thus, as shown in FIG. 5, there is mirror symmetry between: the first quadrant 21 and the second quadrant 22; the second quadrant 22 and the third quadrant 23; the third quadrant 23 and the fourth quadrant 24; and the fourth quadrant 24 and the first quadrant 21.

It may be preferable for the receiver feed line 26, transmitter feed line 28, and connectors 29 to have the same dimensions in each quadrant 21-24 of the unit cell 25. This may provide symmetry and reduce irregularities, improving performance of the antenna array.

It will be appreciated that FIG. 5 is a schematic illustration and so the feed lines 26, 28 and the connectors 29 may not be contained in just a single layer of the package 20.

Figure 6:
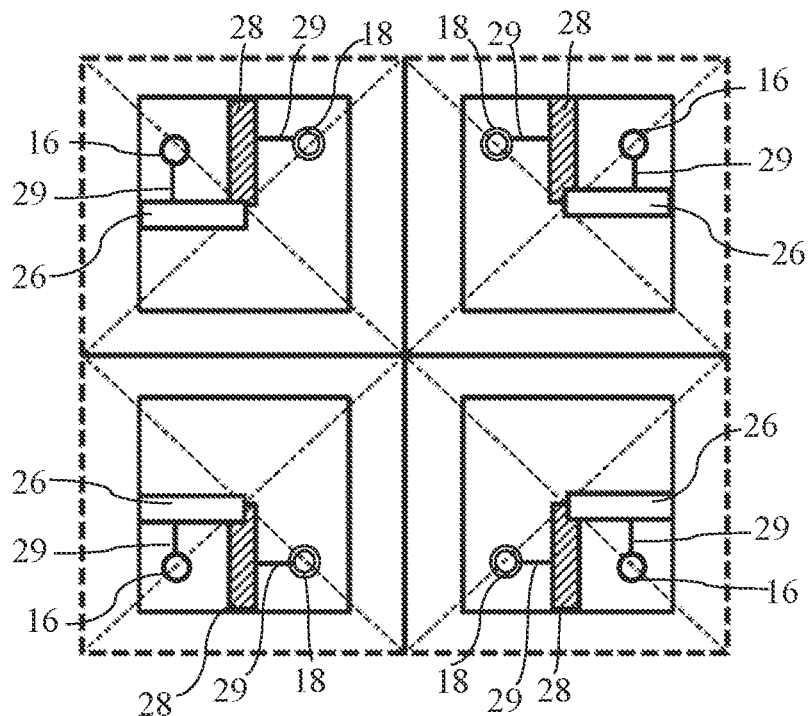
FIG. 6—shows the package unit cell of FIG. 5 overlaying the die unit cell of FIG. 3.

FIG. 6 shows the package unit cell 25 of FIG. 5 overlaying a unit cell 15 of the (or a) die 10 (i.e. when the or each die 10 has been mounted in the package 20). As shown, each receiver feed line 26 is connected to a respective one of the receiver terminals 16 by a connector 29. Each transmitter feed line 28 is connected to a respective one of the transmitter terminals 18 by a connector 29.

Figure 7:
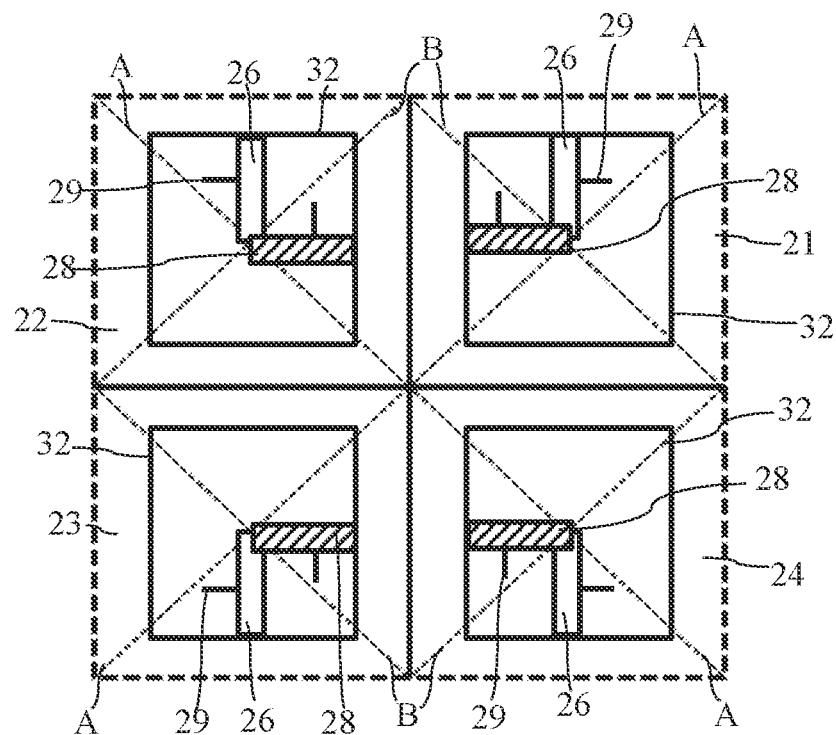
FIG. 7—shows one of the unit cells of the package in FIG. 4 in a second configuration.

FIG. 7 shows a package unit cell 25 in a second configuration. In the second configuration the receiver feed lines 26 are orientated for vertical polarization of the antenna array receiver channel and the transmitter feed lines 28 are orientated for horizontal polarization of the antenna array transmitter channel.

In the second configuration, the orientation of each pair of feed lines 26, 28 has been rotated relative to the first configuration (shown in FIG. 5). In the first quadrant 21 and the third quadrant 23 the pair of feed lines have been rotated 90° clockwise about the centre of the quadrant from the first configuration to arrive at the second configuration. In the second quadrant 22 and the fourth quadrant 24 the pair of feed lines have been rotated 90° anti-clockwise about the centre of the quadrant from the first configuration to arrive at the second configuration. However, there is still mirror symmetry between the nearest neighbour quadrants in the second configuration, as there is in the first configuration.

The rotation of the feed lines 26, 28 can, in some embodiments, just require changes to the construction of a single layer in the package 20 during the package manufacturing process. This is quite a straightforward, and therefore efficient and relatively inexpensive modification to the package.

Figure 8:
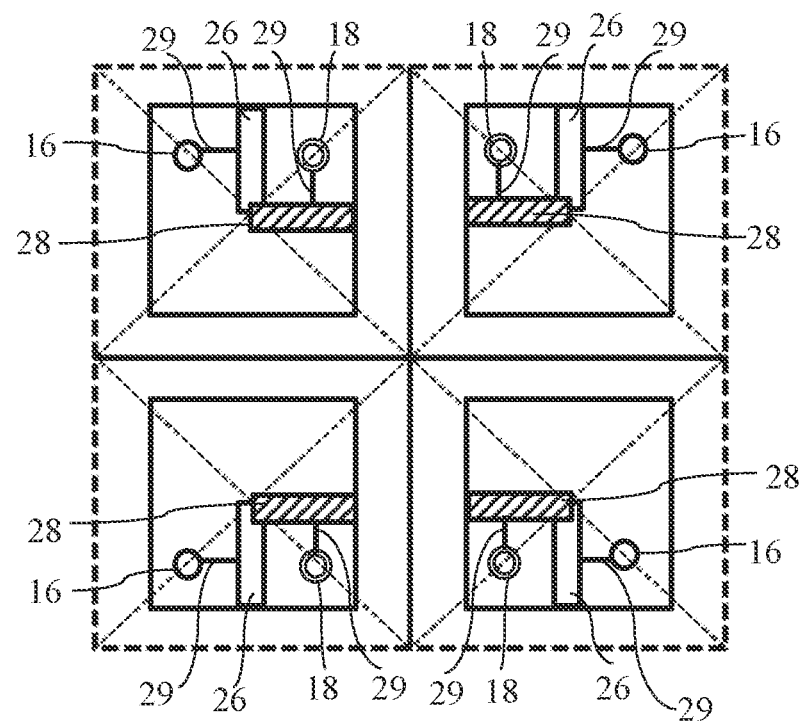
FIG. 8—shows the package unit cell of FIG. 7 overlaying the die unit cell of FIG. 3.

FIG. 8 shows the package unit cell 25 of FIG. 7 overlaying a unit cell 15 of the (or a) die 10 (i.e. when the or each die 10 has been mounted in the package 20). As shown, each receiver feed line 26 is connected to a respective one of the receiver terminals 16 by the corresponding connector 29. Each transmitter feed line 28 is connected to a respective one of the transmitter terminals 18 by the corresponding connector 29.

A comparison between FIGS. 6 and 8 shows that the die terminals 16, 18 are in the same position, thus the same die(s) can be used when the package feed lines are in the first configuration or in the second configuration. This can improve the cost and efficiency of manufacturing integrated circuits or packages, as the same die can be used for different antenna polarizations.

Optionally, the die 10 comprises a phase shifter circuit (not shown). The phase shifter circuit may be configured to selectively apply a phase shift to a signal processed by the receiver channel (i.e. the receiver feed lines) and/or the transmitter channel (i.e. the transmitter feed lines) of the antenna array. In some embodiments, the phase shifter circuit may only be activated in one of the first configuration or the second configuration. For example, in the second configuration as shown in FIG. 8 the die 10 may apply a 180° phase shift to signals processed by the transmitter channel.

Figure 9:
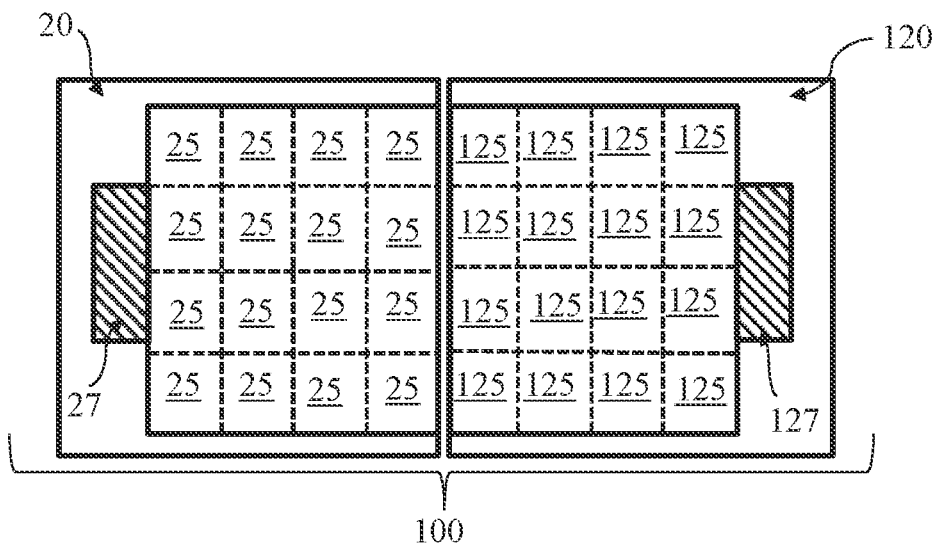
FIG. 9—is a schematic illustration of a first package and a second package according to an embodiment of the present disclosure.

FIG. 9 shows a first package 20 comprising a plurality of unit cells 25 and a UDC 27 (as shown in FIG. 4) and a second package 120 comprising a plurality of unit cells 125 and a UDC 127. The second package 125 may be identical to the first package 20. The first package 20 is mounted adjacent to the second package 120 to form a multi-package module 100. The second package 120 may be rotated 180° relative to the first package 20. Equivalently, the multi-package module may be referred to as an integrated circuit 100 comprising a first package 20 and a second package 120. Thus, the antenna array of the first package 20 and the second package 120 (not shown) may be sub-arrays that together form a larger antenna array.

Methods of forming a multi-package module 100 from at least a first package and a second package are described in detail in European patent application no. EP21157067.6. The methods taught therein are incorporated herein by reference.

The feed lines 26, 28 of the first package 20 and the second package 120 may be in the same configuration. For example, both packages may be in the first configuration, or the second configuration.

Figure 10:
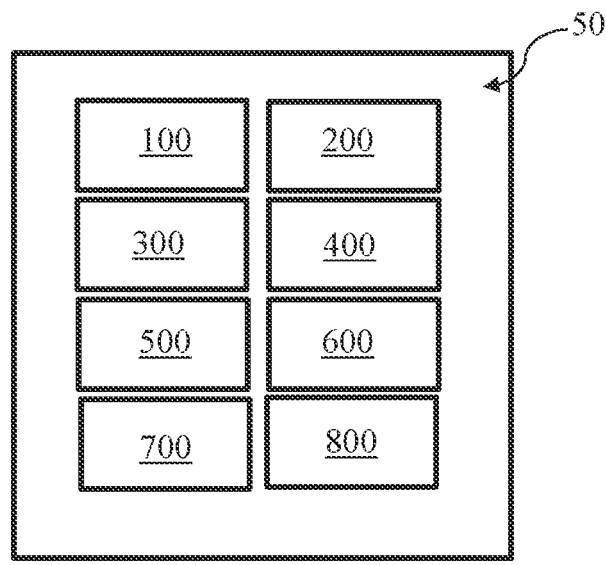
FIG. 10—is a schematic illustration of a 4×2 array of integrated circuits according to an embodiment of the present disclosure.

FIG. 10 shows a schematic illustration of a semiconductor device 50 comprising a 4×2 array of integrated circuits 100-800. Each integrated circuit 100-800 may comprise a package 20, at least one die 10 and a phased antenna array as described above (not shown). It will be appreciated that the array may be of any size. In some embodiments, each integrated circuit 100, 300, 500, 700 in the first column of the array may have a first polarization, and each integrated circuit 200, 400, 600, 800 in the second column of the array may have a second polarization. For example, in each integrated circuit 100, 300, 500, 700 in the first column the pairs of feed lines 26, 28 in the packages may be in the first configuration (as in FIG. 5), and in each integrated circuit 200, 400, 600, 800 in the second column the pairs of feed lines 26, 28 in the packages may be in the second configuration (as in FIG. 7), or vice versa. This may increase the capacity of the overall antenna array. The plurality of dies 10 in each integrated circuit may be identical.

Alternatively, each integrated circuit 100-800 may be a multi-package module comprising at least a first and second package, as shown in FIG. 9.

Figure 11:
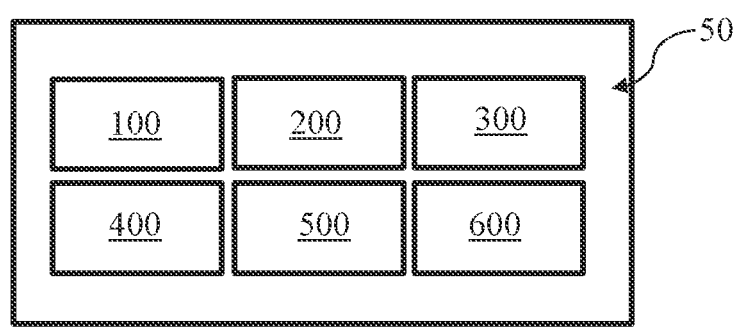
FIG. 11—is a schematic illustration of a 2×3 array of integrated circuits according to an embodiment of the present disclosure.

FIG. 11 shows a schematic illustration of another embodiment of a semiconductor device 50. The semiconductor device 50 comprises a 2×3 array of integrated circuits or multi-pack modules 100-600.

In some embodiments, each integrated circuit 100, 200, 300 in the first row of the array may have a first polarization and each integrated circuit 400, 500, 600 in the second row of the array may have a second polarization. For example, in each integrated circuit 100, 200, 300 in the first row the pairs of feed lines 26, 28 in the packages may be in the first configuration (as in FIG. 5), and in each integrated circuit 400, 500, 600 in the second row the pairs of feed lines 26, 28 in the packages may be in the second configuration (as in FIG. 7), or vice versa. This may increase the capacity of the overall antenna array. The plurality of dies 10 in each integrated circuit may be identical.

The present disclosure may reduce irregularities and asymmetry in arrays formed of multiple integrated circuits, for example as shown in FIGS. 10 and 11. This is because the same die can be used in the integrated circuits regardless of the polarization required by the antenna array. In addition, allowing the same die to be used in different package configurations reduces costs and improves efficiency of the manufacturing process.

Accordingly, there has been described an integrated circuit comprising a package, a phased antenna array comprising a plurality of antenna elements and a die contained within the package. The die comprises a plurality of unit cells, wherein each unit cell is divided into quadrants, and each quadrant comprises a receiver terminal located on a first axis of the quadrant; and a transmitter terminal located on a second axis of the quadrant, wherein the first axis is orthogonal to the second axis, wherein there is mirror symmetry between the nearest neighbour quadrants in the unit cell. The package comprises a plurality of pairs of feed lines, each pair of feed lines comprising a receiver feed line and a transmitter feed line, wherein the receiver feed line is connected to one of the receiver terminals and the transmitter feed line is connected to the transmitter terminal in the same quadrant of the die, wherein the receiver feed line is orthogonal to the transmitter feed line. Each antenna element of the phased antenna array is coupled to a respective pair of feed lines to drive a receiver channel and a transmitter channel of the phased antenna array.

Although particular embodiments of this disclosure have been described, it will be appreciated that many modifications/additions and/or substitutions may be made within the scope of the claims.

The invention claimed is:

1. An integrated circuit comprising:
a package;
a phased antenna array comprising a plurality of antenna elements; and
a die contained within the package;
wherein the die comprises a plurality of unit cells, wherein each unit cell is divided into quadrants, and each quadrant comprises:
a receiver terminal located on a first axis of the quadrant; and
a transmitter terminal located on a second axis of the quadrant, wherein the first axis is orthogonal to the second axis,
wherein there is mirror symmetry between the nearest neighbour quadrants in the unit cell;
wherein the package comprises:
a plurality of pairs of feed lines, each pair of feed lines comprising a receiver feed line and a transmitter feed line, wherein the receiver feed line is connected to one of the receiver terminals and the transmitter feed line is connected to the transmitter terminal in the same quadrant of the die, wherein the receiver feed line is orthogonal to the transmitter feed line; and
wherein each antenna element of the phased antenna array is coupled to a respective pair of feed lines to drive a receiver channel and a transmitter channel.

2. The integrated circuit of claim 1, wherein the plurality of pairs of feed lines have a first configuration and second configuration, wherein:
in the first configuration the receiver channel has a horizontal polarization and the transmitter channel has a vertical polarization; and
in the second configuration the receiver channel has a vertical polarization and the transmitter channel has a horizontal polarization.

3. The integrated circuit of claim 2, wherein in the first configuration each pair of feed lines is rotated 90° relative to the second configuration.

4. The integrated circuit of claim 2, wherein the package comprises a plurality of unit cells and each unit cell is divided into quadrants, wherein:
each quadrant comprises one of the pairs of feed lines;
each unit cell of the package overlays a respective unit cell of the die; and
in the first configuration each pair of feed lines is rotated 90° in the opposite direction to the nearest neighbour quadrants in the unit cell, relative to the second configuration.

5. The integrated circuit of claim 2, wherein the die comprises a phase shifter circuit, wherein the phase shifter circuit is configured to apply a 180 degree phase shift to a signal processed the receiver channel and/or the transmitter channel.

6. The integrated circuit of claim 2, further comprising a plurality of dies contained in the package, wherein each die comprises at least one unit cell, wherein each unit cell is divided into quadrants, and each quadrant comprises:
   a receiver terminal located on a first axis of the quadrant; and
   a transmitter terminal located on a second axis of the quadrant, wherein the first axis is orthogonal to the second axis,
   wherein the location of the receiver terminal and the transmitter terminal in the nearest neighbour quadrants in the unit cell has mirror symmetry.

7. The integrated circuit of claim 1, wherein the package comprises a plurality of unit cells and each unit cell is divided into quadrants, wherein:
   each quadrant comprises one of the pairs of feed lines; and
   each unit cell of the package overlays a respective unit cell of the die.

8. The integrated circuit of claim 7, wherein the orientation of the pair of feed lines in the nearest neighbour quadrants in each unit cell of the package has mirror symmetry.

9. The integrated circuit of claim 1, wherein the die comprises a phase shifter circuit, wherein the phase shifter circuit is configured to apply a 180 degree phase shift to a signal processed the receiver channel and/or the transmitter channel.

10. The integrated circuit of claim 1, further comprising a plurality of dies contained in the package, wherein each die comprises at least one unit cell, wherein each unit cell is divided into quadrants, and each quadrant comprises:
    a receiver terminal located on a first axis of the quadrant; and
    a transmitter terminal located on a second axis of the quadrant, wherein the first axis is orthogonal to the second axis,
    wherein the location of the receiver terminal and the transmitter terminal in the nearest neighbour quadrants in the unit cell has mirror symmetry.

11. The integrated circuit of claim 10, wherein the plurality of dies are identical.

12. The integrated circuit of claim 1, wherein the first axis and the second axis are each axes of symmetry of the quadrant, and/or wherein the first axis and the second axis are each diagonal axes.

13. The integrated circuit of claim 1, wherein in each quadrant of the, or each, die the receiver terminal and the transmitter terminal are aligned along a third axis.

14. The integrated circuit of claim 1, wherein each unit cell of the, or each, die comprises a first quadrant, a second quadrant, a third quadrant and a fourth quadrant, wherein in each unit cell there is mirror symmetry between:
    the first quadrant and the second quadrant;
    the second quadrant and the third quadrant;
    the third quadrant and the fourth quadrant; and
    the fourth quadrant and the first quadrant.

15. The integrated circuit of claim 1, wherein in each pair of feed lines the receiver feed line has the same dimensions as the transmitter feed line, or wherein each receiver feed line has the same dimensions as each transmitter feed line.

16. A semiconductor device, comprising:
    a plurality of integrated circuits arranged to form an array, wherein each integrated circuit is as defined in claim 1.

17. A method of manufacturing an integrated circuit, comprising:
    providing a die, wherein the die comprises a plurality of unit cells, wherein each unit cell is divided into quadrants, and each quadrant comprises:
       a receiver terminal located on a first axis of the quadrant; and
       a transmitter terminal located on a second axis of the quadrant, wherein the first axis is orthogonal to the second axis,
       wherein the location of the receiver terminal and the transmitter terminal in the nearest neighbour quadrants in the unit cell has mirror symmetry;
    providing a phased antenna array comprising a plurality of antenna elements; and
    assembling a package, wherein assembling the package comprises:
       encasing the die in the package;
       providing a plurality of pairs of feed lines, each pair of feed lines comprising a receiver feed line and a transmitter feed line,
       connecting the receiver feed line to one of the receiver terminals and connecting the transmitter feed line to the transmitter terminal in the same quadrant of the die, wherein the receiver feed line is orthogonal to the transmitter feed line; and
       coupling each antenna element of the phased antenna array to a respective pair of feed lines to drive a receiver channel and a transmitter channel.

* * * * *